United States Patent
Karino

(10) Patent No.: US 10,297,490 B2
(45) Date of Patent: May 21, 2019

(54) SEMICONDUCTOR DEVICE AND METHOD FOR MANUFACTURING SEMICONDUCTOR DEVICE

(71) Applicant: FUJI ELECTRIC CO., LTD., Kawasaki (JP)

(72) Inventor: Taichi Karino, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/017,344

(22) Filed: Jun. 25, 2018

(65) Prior Publication Data
US 2019/0051556 A1    Feb. 14, 2019

(30) Foreign Application Priority Data

Aug. 9, 2017  (JP) .................................. 2017-153887

(51) Int. Cl.
| | |
|---|---|
| H01L 23/525 | (2006.01) |
| H01L 21/761 | (2006.01) |
| H01L 23/62 | (2006.01) |
| H01L 27/112 | (2006.01) |

(52) U.S. Cl.
CPC ........ *H01L 21/761* (2013.01); *H01L 23/5258* (2013.01); *H01L 23/62* (2013.01); *H01L 27/11206* (2013.01)

(58) Field of Classification Search
CPC . H01L 23/5258; H01L 23/62; H01L 27/11206
See application file for complete search history.

(56) References Cited

U.S. PATENT DOCUMENTS

| | | | | |
|---|---|---|---|---|
| 5,879,966 A | * | 3/1999 | Lee ...................... | H01L 23/5258 148/DIG. 55 |
| 6,177,714 B1 | * | 1/2001 | Nagai ................. | H01L 23/5258 257/529 |
| 6,300,232 B1 | * | 10/2001 | Satoh ................... | H01L 23/5258 438/601 |
| 6,373,120 B1 | * | 4/2002 | Oiyama .............. | H01L 23/5258 257/209 |
| 7,745,343 B1 | * | 6/2010 | Lo ....................... | H01L 23/5258 438/601 |
| 2001/0002322 A1 | * | 5/2001 | Marr ................... | H01L 23/5256 438/132 |

(Continued)

FOREIGN PATENT DOCUMENTS

| | | | |
|---|---|---|---|
| JP | 3-83361 | | 4/1991 |
| JP | 09017874 A | * | 1/1997 |

(Continued)

*Primary Examiner* — George R Fourson, III

(57) ABSTRACT

A semiconductor device includes a semiconductor substrate of a first conductivity type, a plurality of short-circuit prevention-regions of a second conductivity type at an upper portion of the semiconductor substrate, a first insulating film on a top surface of the semiconductor substrate, a strip-shaped fuse on a top surface of the first insulating film spanning over the short-circuit prevention-regions, a second insulating film on a top surface of the fuse, and a passivation film on a top surface of the second insulating film and having an opening for laser trimming. The opening exposes the second insulating film above an area including the short-circuit prevention-regions.

4 Claims, 12 Drawing Sheets

(56) References Cited

U.S. PATENT DOCUMENTS

| | | | |
|---|---|---|---|
| 2002/0038902 A1 | 4/2002 | Naiki | |
| 2004/0183155 A1* | 9/2004 | Seto | H01L 23/3114 |
| | | | 257/529 |
| 2005/0133882 A1* | 6/2005 | Young | H01L 23/5256 |
| | | | 257/529 |
| 2006/0087002 A1* | 4/2006 | Miwa | H01L 23/5258 |
| | | | 257/529 |
| 2006/0118904 A1* | 6/2006 | Liaw | H01L 23/5258 |
| | | | 257/529 |
| 2014/0210042 A1* | 7/2014 | Hasegawa | H01L 23/5258 |
| | | | 257/529 |

FOREIGN PATENT DOCUMENTS

| | | |
|---|---|---|
| JP | 2002-110806 | 4/2002 |
| JP | 2006-41257 | 2/2006 |
| JP | 2013-157468 | 8/2013 |

* cited by examiner

SEMICONDUCTOR DEVICE AND METHOD FOR MANUFACTURING SEMICONDUCTOR DEVICE

CROSS-REFERENCE TO RELATED APPLICATION

This application claims the benefit of foreign priority to Japanese Patent Application No. JP2017-153887, filed Aug. 9, 2017, which is incorporated by reference in its entirety.

BACKGROUND OF THE INVENTION

1. Field of the Invention

The present invention relates to a semiconductor device including a fuse for laser trimming and a method for manufacturing the semiconductor device.

2. Description of the Related Art

For switching the functions of a semiconductor integrated circuit (IC), or adjusting the operating parameters in the IC, laser trimming is performed. Depending on the item to be adjusted in the IC, after a fuse to be blown is confirmed in accordance with a result of a wafer test, for example, the material of the fuse is vaporized by laser irradiation, and the fuse is cut out (blow) so as to perform the laser trimming.

In the conventional laser trimming performed on the semiconductor device, cracks are created by the laser irradiation in an insulating film, which is disposed under the fuse, because of variation in the thickness of an insulating film above the fuse or variation in laser energy, and edges of a removed part of the fuse are brought into contact with the surface of a semiconductor substrate under the insulating film via the cracks. This may cause a short-circuit failure between the fuse and the semiconductor substrate. JP H03 (1991)-083361A (Patent-Literature 1) discloses a semiconductor device including a semiconductor substrate and an impurity-doped region provided on an upper portion of the semiconductor substrate, the impurity-doped region having the opposite conductivity type to the semiconductor substrate so as to suppress a short-circuit failure.

The structure of the semiconductor device disclosed in Patent-Literature 1 can suppress a direct short-circuit failure between the fuse and the semiconductor substrate when one end of a removed part of the fuse is brought into contact with the surface of the impurity-doped region. However, the semiconductor device disclosed in Patent-Literature 1 has a problem of causing a fault upon trimming because a path for a leakage current is formed when both ends of the removed part of the fuse are brought into contact with the surface of the impurity-doped region and thus are connected to each other via the impurity-doped region.

SUMMARY OF THE INVENTION

In view of the foregoing problem, the present invention provides a semiconductor device having a fuse for laser trimming, the semiconductor device has a structure capable of suppressing a fault upon the laser trimming, and provides a method for manufacturing the semiconductor device.

In order to achieve the object, a first aspect of the present invention inheres in a semiconductor device encompassing: a semiconductor substrate of a first conductivity type; a plurality of short-circuit prevention-regions of a second conductivity type buried in an upper portion of the semiconductor substrate and separated from each other; a first insulating film laminated on a top surface of the semiconductor substrate; a strip-shaped fuse provided on a top surface of the first insulating film, spanning over the plurality of short-circuit prevention-regions; a second insulating film covering a top surface of the fuse; and a passivation film stacked on a top surface of the second insulating film and having an opening for laser trimming, wherein the opening exposes the second insulating film above an area, in which the plurality of short-circuit prevention-regions is included.

A second aspect of the present invention inheres in a method for manufacturing a semiconductor device encompassing: forming a plurality of short-circuit prevention-regions of a second conductivity type, being separated from each other, in an upper portion of a semiconductor substrate of a first conductivity type; forming a first insulating film on a top surface of the semiconductor substrate; delineating a fuse on a top surface of the first insulating film into a strip pattern so as to span over the plurality of short-circuit prevention-regions; covering a second insulating film on a top surface of the fuse; depositing a passivation film on a top surface of the second insulating film; and cutting an opening for laser trimming in the passivation film and expose the second insulating film above an area including the plurality of short-circuit prevention-regions.

DETAILED DESCRIPTION

Figure 1:
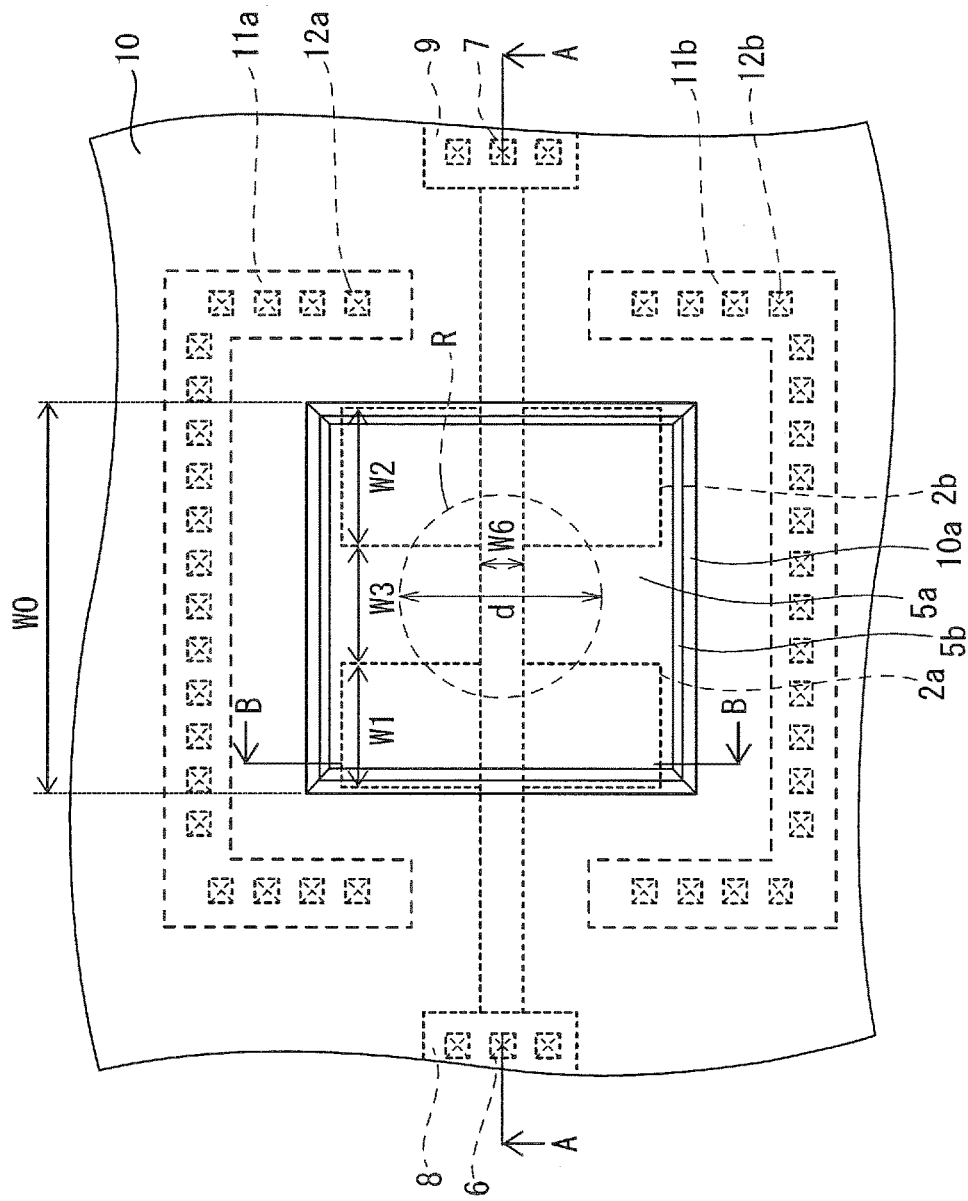
FIG. 1 is a plan view illustrating a semiconductor device according to an embodiment of the present invention.

An embodiment of the present invention will be described below with reference to the Drawings. In the description of the Drawings to be referred, the same or similar elements are indicated by the same or similar reference numerals. It should be understood that the Drawings are illustrated schematically, and relationships of thicknesses and planar dimensions, and proportions of the respective layers are not drawn to scale. The specific thicknesses and dimensions should be considered in accordance with the following description. It should also be understood that the respective Drawings are illustrated with the dimensional relationships and proportions different from each other.

While the embodiment of the present invention below will exemplify a case in which a first conductivity type is "p-type" and a second conductivity type is "n-type", the first and second conductivity types may be assigned in the inverted manner such that the first conductivity type is "n-type" and the second conductivity type is "p-type". In the Specification and the appended Drawings, the superscript "+" or "−" added to the mark "n" or "p" denotes that a semiconductor region has a higher or lower impurity concentration than a region without the superscript "+" or "−" added. It is apparent to a person skilled in the art technically and logically that, in the following description, a member or region to which the limitation "first conductivity type" or "second conductivity type" is added refers to a member or region made of a semiconductor material regardless of the presence or absence of the explanation.

In the following description, the terms "top" and "bottom" in, for example, "top surface" and "bottom surface" are defined depending on cross-sectional views. For example, when the direction of a semiconductor device is changed by 90 degrees and is then observed, the terms "top" and "bottom" change to the terms "left" and "right". When the observing direction of the semiconductor device is changed by 180 degrees, the terms "top" and "bottom" shall be reversed.

In the following description, a "semiconductor substrate" is not limited to a wafer of a raw material obtained such that an ingot grown by a Czochralski (CZ) method or a floating zone (FZ) method is cut into a wafer. As used herein, the "semiconductor substrate" collectively includes, in addition to the wafer of the raw material, a substrate having a laminated structure subjected to various kinds of processing, such as an epitaxially grown substrate, in which an epitaxial-layer is grown on the top surface of a raw substrate such as the wafer, or a silicon-on-insulator (SOI substrate), in which an insulating film is in contact with the bottom surface of a silicon layer. Namely, the "semiconductor substrate" is a general term as a superordinate concept, which may include not only the raw substrate but also any substrate having various kinds of laminated structures with the raw substrate or active areas defined in a part of the laminated structures.

<Structure of Semiconductor Device>

Figure 2:
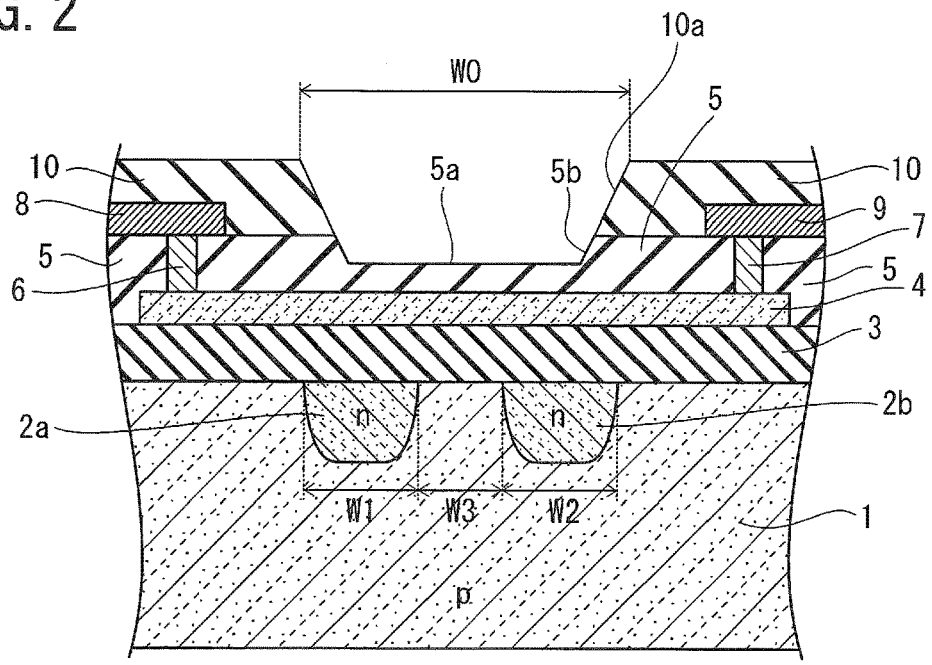
FIG. 2 is a cross-sectional view as viewed from direction A-A in FIG. 1.

As illustrated in FIG. 1 and FIG. 2, a semiconductor device according to the embodiment of the present invention includes a semiconductor substrate 1 of a first conductivity type (p-type), a plurality of short-circuit prevention-regions (impurity-doped regions) 2a and 2b of a second conductivity type (n-type) buried in an upper portion of the semiconductor substrate 1, a first insulating film (a base insulating film) 3 laminated on the top surface of the semiconductor substrate 1, and a strip-shaped fuse for laser trimming (a laser trimming fuse) 4, which is delineated into a long rectangular pattern, disposed on the top surface of the first insulating film 3. A second insulating film (an interlayer insulating film) 5 covers the top surfaces of the first insulating film 3 and the fuse 4, and a passivation film 10 is stacked on the top surface of the second insulating film 5.

For laser trimming, an opening 10a is cut in the passivation film 10. The opening 10a is allocated above an area including at least the plurality of short-circuit prevention-regions 2a and 2b. As the opening 10a penetrates the passivation film 10, a recess is cut at the top surface of the second insulating film 5a so that a part of the upper level portion of the second insulating film 5 is exposed. As illustrated in FIG. 1, the opening 10a has a rectangular shape (a square shape) in a planar pattern, for example. The width W0 of the opening 10a is approximately 10 micrometers, for example.

The semiconductor substrate 1 may be a semiconductor wafer made of silicon (Si) used as a base material. Although not illustrated in the Drawings, in addition to the fuse, any circuit-elements such as a plurality of metal-oxide-semiconductor field-effect transistors (MOSFETs), diodes, and resistors may be merged in the semiconductor substrate 1 so as to define an integrated circuit (IC). Or alternatively, a plurality of bipolar junction transistors (BJTs) can be merged in the IC.

As illustrated in a planar pattern of FIG. 1, the shapes of the respective short-circuit prevention-regions 2a and 2b are rectangular, each having a longer side along a direction perpendicular to the longitudinal direction of the fuse 4. Here, the short-circuit prevention-regions 2a and 2b serve as floating semiconductor regions, which are kept in electrically floating states, respectively. The short-circuit prevention-regions 2a and 2b are separated and arranged in parallel to each other. The middle portion of the fuse 4 in the longitudinal direction is sandwiched in between the short-circuit prevention-region 2a and the short-circuit prevention-region 2b. The side ends on the outer side of the short-circuit prevention-regions 2a and 2b substantially overlap with the outline of the opening 10a. The widths W1 and W2 of the short-circuit prevention-regions 2a and 2b defined in FIG. 1 and FIG. 2 are each approximately in a range of one micrometer to 10 micrometers, and the space W3 between the respective short-circuit prevention-regions 2a and 2b is approximately two micrometers, for example. The depths of the respective short-circuit prevention-regions 2a and 2b measured from the top surface of the semiconductor substrate 1 in the cross-sectional view of FIG. 2 are approximately 0.3 micrometer.

As illustrated in FIG. 2, the short-circuit prevention-region 2a implements p-n junction with the semiconductor substrate 1, and similarly, the short-circuit prevention-region 2b implements p-n junction with the semiconductor substrate 1. With the structure of the p-n junctions, the respective short-circuit prevention-regions 2a and 2b have the function of preventing a short-circuit failure between edges of removed parts of the fuse 4 and the semiconductor substrate 1. Namely, the short-circuit failure is susceptible to destruction of the first insulating film 3 caused by the laser irradiation for the laser trimming. The impurity concentration and the depth of the respective short-circuit prevention-regions 2a and 2b are each set such that a breakdown voltage is greater than or equal to a voltage applied to the fuse 4. For example, when the voltage applied to the fuse 4 is approximately five volts, the junction breakdown voltage between the short-circuit prevention-regions 2a and 2b and the semiconductor substrate 1 and the punch-through breakdown voltage between the respective short-circuit prevention-regions 2a and 2b are each preferably approximately 10 volts or higher.

The thickness of the first insulating film 3 is approximately in a range of 0.4 to 0.6 micrometer. The first insulating film 3 used may be a silicon oxide ($SiO_2$) film, a silicon nitride ($Si_3N_4$) film, or a composite of these films. Alternatively, the first insulating film 3 may be a field oxide film formed by local oxidation of silicon (LOCOS) or shallow trench isolation (STI) architecture, or an oxide film continued from the field oxide film.

The fuse 4 is a resistor layer elongated in a strip pattern, which spans over the short-circuit prevention-regions 2a and 2b. The width W6 of the fuse 4 is approximately in a range of one micrometer to 1.5 micrometers, and the thickness of the fuse 4 is approximately 0.2 micrometer, for example. FIG. 1 schematically illustrates a region (a laser irradiation region) R by the broken line, which is irradiated with a laser beam used for the laser trimming. A substantially rectangular area defined in the fuse 4, which is included in the laser irradiation area R, is supposed to be cut out during the laser trimming. The spot size (the diameter) d of the laser irradiation area R is approximately in a range of five to six micrometers. Under both ends of the fuse 4, a couple of the partial areas allocated at both inner portions of the facing short-circuit prevention-regions 2a and 2b are arranged so as to be included in the laser irradiation area R.

The material used for the fuse 4 may be heavily-doped polysilicon, polycide, or metallic materials. Examples of silicide films implementing the polycide include titanium silicide ($TiSi_2$), cobalt silicide ($CoSi_2$), and tungsten silicide ($WSi_2$). Other examples included in the polycide may include tantalum silicide ($TaSi_2$), molybdenum silicide (MoSi), and nickel silicide (NiSi). Examples of metallic materials may include aluminum (Al), gold (Au), copper (Co), and refractory metals such as platinum (Pt), titanium (Ti), and tungsten (W).

The second insulating film 5 may be a $SiO_2$ film, a phosphosilicate glass (PSG) film, a borosilicate glass (BSG) film, a borophosphosilicate glass (BPSG) film, or a composite of these films. Alternatively, the second insulating film 5 may be an insulating film of an organosilicon compound deposited by a chemical vapor deposition (CVD) method using tetraethoxysilane (TEOS) gas.

A part of the second insulating film 5 corresponding to the position of the opening 10a above an area including at least the couple of short-circuit prevention-regions 2a and 2b is formed into a recess 5a. The recess 5a is cut such that the thickness of the second insulating film 5 is adjusted so as to facilitate the vaporization of the fuse 4 by the laser irradiation. The thickness of the second insulating film 5 at the bottom of the recess 5a is thinner than a peripheral portion around the recess 5a. The thickness of the second insulating film 5 at the bottom of the recess 5a is approximately in a range of 0.1 to 0.5 micrometer, and the thickness of the peripheral portion around the recess 5a is approximately in a range of 0.7 to 1 micrometer, for example. The respective thicknesses are not limited to these ranges, and may be adjusted as appropriate. The second insulating film 5 does not necessarily have the recess 5a at the opening 10a, and may have a flat top surface instead.

Wiring layers 8 and 9 are provided on the top surface of the second insulating film 5. The material used for the wiring layers 8 and 9 may be Al—Si, Al—Si—Cu, or Al—Cu. Damascene wiring using copper may also be used. The wiring layer 8 is connected to one end of the fuse 4 via contact plug 6, and the wiring layer is connected to another end of the fuse 4 via contact plug 7. The contact plugs 6 and 7 may be made of either refractory metal such as tungsten or the material used for the wiring layers 8 and 9. FIG. 2 illustrates a case in which the wiring layers 8 and 9 are made of refractory metal.

The passivation film 10 may be a $Si_3N_4$ film different from the second insulating film 5 so as to implement a composite film together with the second insulating film 5. Since the $Si_3N_4$ film absorb the laser beam at a higher rate, the passivation film 10 above the fuse 4 is removed to establish the opening 10a for the laser irradiation. FIG. 2 illustrates a case in which a hole implementing the upper portion of the opening 10a, which penetrates the passivation film 10, has a tapered upper sidewall, and a lower sidewall 5b at the recess 5a of the second insulating film 5 continued from the upper sidewall at the opening 10a also has a tapered shape.

Although not illustrated in FIG. 2, n-type guard ring regions 11a and 11b are provided at the upper portion of the semiconductor substrate 1. The guard ring regions 11a and 11b have a U-like shape, respectively. The U-shaped guard ring regions 11a and 11b are mutually facing so that the guard ring regions 11a and 11b can surround the opening 10a in the passivation film 10, as illustrated in FIG. 1. Therefore, the guard ring regions 11a and 11b are opposed to each other, interposing the fuse 4 in between the guard ring regions 11a and 11b. A plurality of contact plugs 12a are arranged on the upper surface of the guard ring region 11a, and a plurality of contact plugs 12b are arranged on the upper surface of the guard ring regions 11b. The plurality of contact plugs 12a and 12b are provided so as to be electrically connected to an interconnection level, which is the same level as the wiring layers 8 and 9 or another upper wiring layer. The semiconductor device according to the embodiment of the present invention may have a structure in which a plurality of unit-cells, such as the active element cells or the logical blocks, are arranged into a matrix form. When the plurality of unit-cells are arranged into a matrix form, each unit-cell may include respectively the fuse 4, the short-circuit prevention-regions 2a and 2b corresponding to the fuse 4, and the opening 10a above the fuse 4, as illustrated in FIG. 1. The plural unit-cells may be surrounded either dependently or collectively by the guard ring regions.

Figure 3:
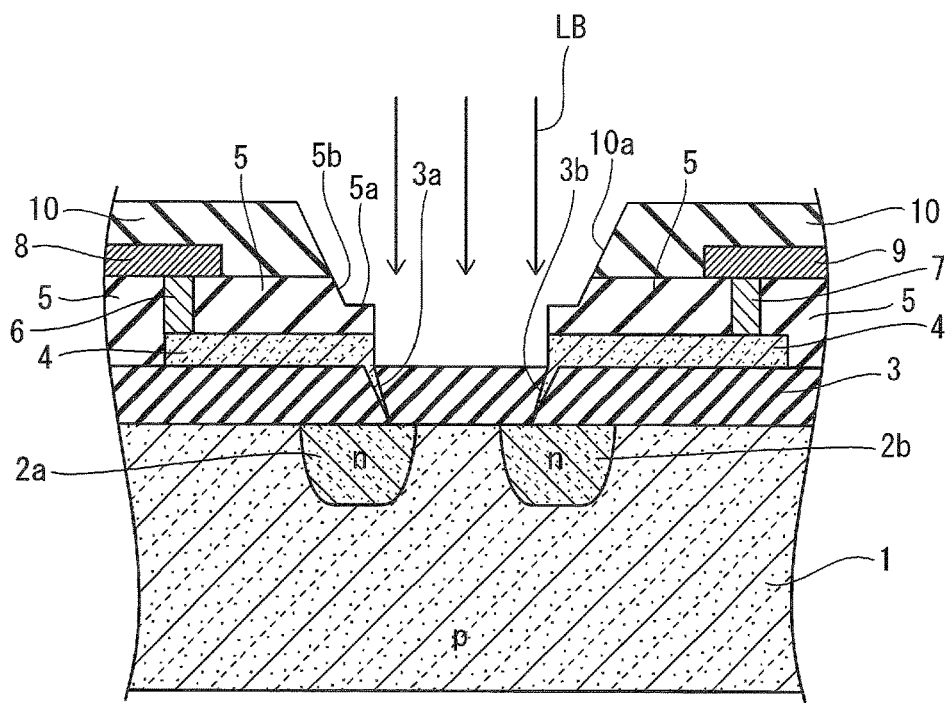
FIG. 3 is a cross-sectional view of the semiconductor device during laser trimming according to the embodiment of the present invention.

Next, a process of the laser trimming performed on the semiconductor device according to the embodiment of the present invention is illustrated below. The laser irradiation area R within the opening 10a of the passivation film 10 illustrated in FIG. 1 is irradiated with a laser beam LB to blow the fuse 4, as illustrated in FIG. 3. The irradiation conditions of the laser beam LB may be a wavelength of 1340 nanometers and a pulse width of 10 nanoseconds, or a wavelength of 1064 nanometers and a pulse width of seven nanoseconds.

FIG. 3 illustrates a state in which the second insulating film 5 located in the laser irradiation area R is removed by the laser irradiation. Alternatively, after the laser beam LB has penetrated through the second insulating film 5 located in the laser irradiation area R so that the fuse 4 can be removed, the second insulating film 5 located in the laser irradiation area R may remain partly or entirely. Normally, the material of the fuse 4 located in the laser irradiation area R is evaporated, being blown by the laser beam LB.

Although the first insulating film 3 below the fuse 4 located in the laser irradiation area R remains, because of variation in the thickness of the recess 5a of the second insulating film 5 or variation in laser energy, cracks 3a and 3b may be created by the laser irradiation in the first insulating film 3 in a location adjacent to the removed part of the fuse 4 As a result, the material of the fuse 4 may enter into the cracks 3a and 3b, and one or both edges of the removed part of the fuse 4 may reach the top surface of the semiconductor substrate 1. However, isolation regions are provided in the upper portion of the semiconductor substrate 1, the isolation regions are implemented by the p-n junctions between the semiconductor substrate 1 and the respective short-circuit prevention-regions 2a and 2b, which are buried in the upper portion of the semiconductor substrate 1. Therefore, a direct short-circuit failure between the fuse 4 and the semiconductor substrate 1 can be suppressed by the isolation regions, when the edge (or edges) of the removed part of the fuse 4 reach the top surface of the semiconductor substrate 1.

In addition, because the short-circuit prevention-region 2a, the semiconductor substrate 1 and the short-circuit prevention-region 2b implement n-p-n structure, the short-circuit prevention-regions 2a and 2b can be electrically isolated from each other, even if the both edges of the removed part of the fuse 4 might be brought into contact with the respective short-circuit prevention-regions 2a and 2b. In the paths defined between the both edges of the removed part of the fuse 4 via the short-circuit prevention-regions 2a and 2b, because two potential barriers are present in the n-p-n structure, a path for a leakage current connecting the both edges of the removed part of the fuse 4 is not formed, and therefore, a trimming fault can be prevented.

Figure 4:
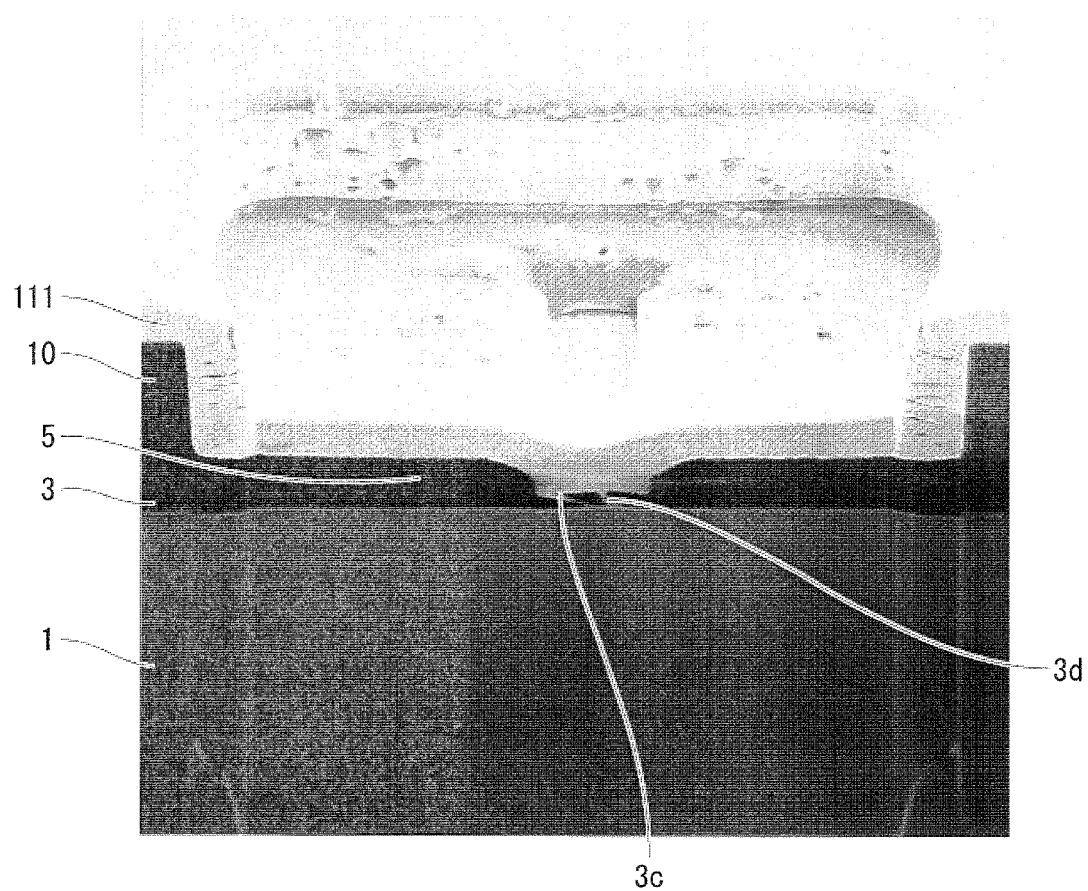
FIG. 4 is a scanning electron microscope (SEM) micrograph showing a cross section of the semiconductor device according to the embodiment of the present invention.
Figure 5:
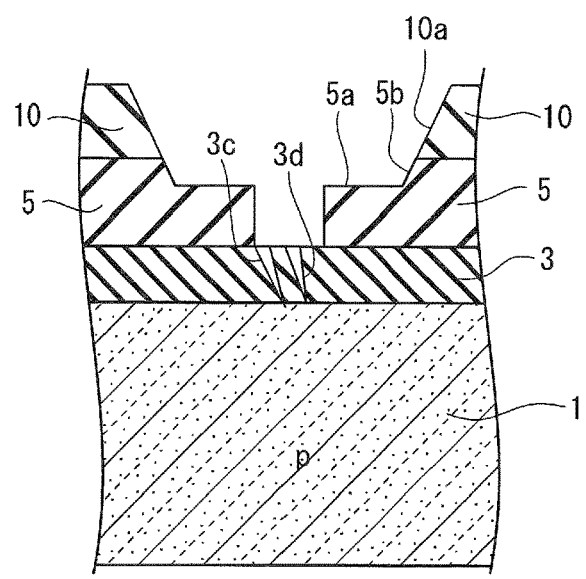
FIG. 5 is a cross-sectional view corresponding to FIG. 4.

FIG. 4 is a scanning electron microscope (SEM) micrograph corresponding to the cross section of the semiconductor device according to the embodiment of the present invention, after the laser trimming, taken from direction B-B in FIG. 1. And FIG. 5 is a schematic cross-sectional view corresponding to FIG. 4. A protection-film-for-observation 111 shown in FIG. 4, which is not shown in FIG. 5, is a dummy film for obtaining the SEM micrograph. In FIG. 4 and FIG. 5, the opening of the second insulating film 5 corresponds to the removed part of the fuse 4 made of a polysilicon film. It is clear from FIG. 4 that cracks 3c and 3d are created in the first insulating film 3 immediately below the opening of the second insulating film 5 corresponding to the removed part of the fuse 4, and the cracks 3c and 3d reach the top surface of the Si substrate 1. The polysilicon, which is the material of the fuse 4, will enter the cracks 3c and 3d, and the polysilicon may reach the Si substrate 1. The phenomenon of the penetration of polysilicon into the Si substrate 1 observed at transverse direction illustrated in FIG. 5 may occur also in the longitudinal direction illustrated in FIG. 3, at portions adjacent to the removed part of the fuse 4.

Comparative Example

Figure 19:
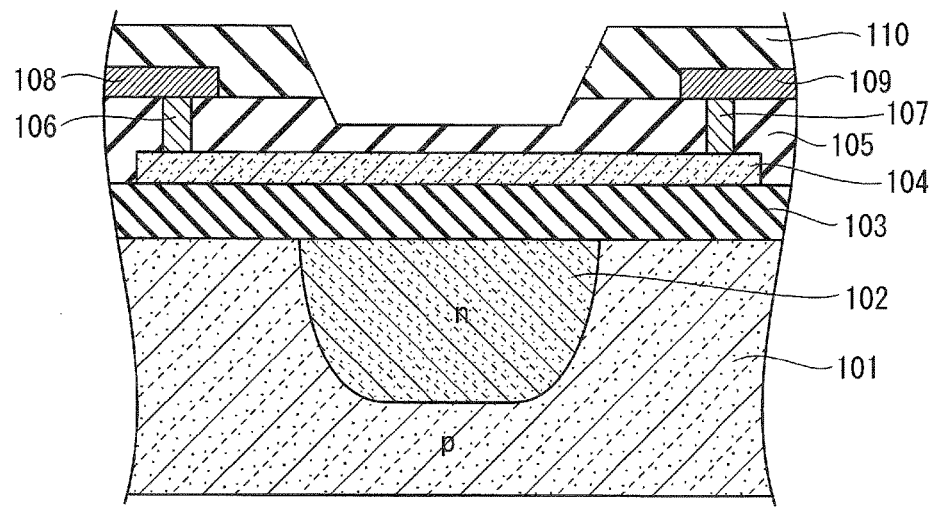
FIG. 19 is a cross-sectional view of a semiconductor device according to a comparative example.

A semiconductor device according to a comparative example is described below. As illustrated in FIG. 19, the semiconductor device according to the comparative example includes a p-type semiconductor substrate 101, an n-type impurity-doped region 102 buried in the upper portion of the semiconductor substrate 101, a first insulating film 103 disposed on the top surface of the semiconductor substrate 101, a fuse 104 provided on the top surface of the first insulating film 103, a second insulating film 105 covering the top surface of the fuse 104, and a passivation film 110 laminated on the top surface of the second insulating film 105. The both ends of the fuse 104 are connected with wiring layers 108 and 109 via contact plugs 106 and 107.

Figure 20:
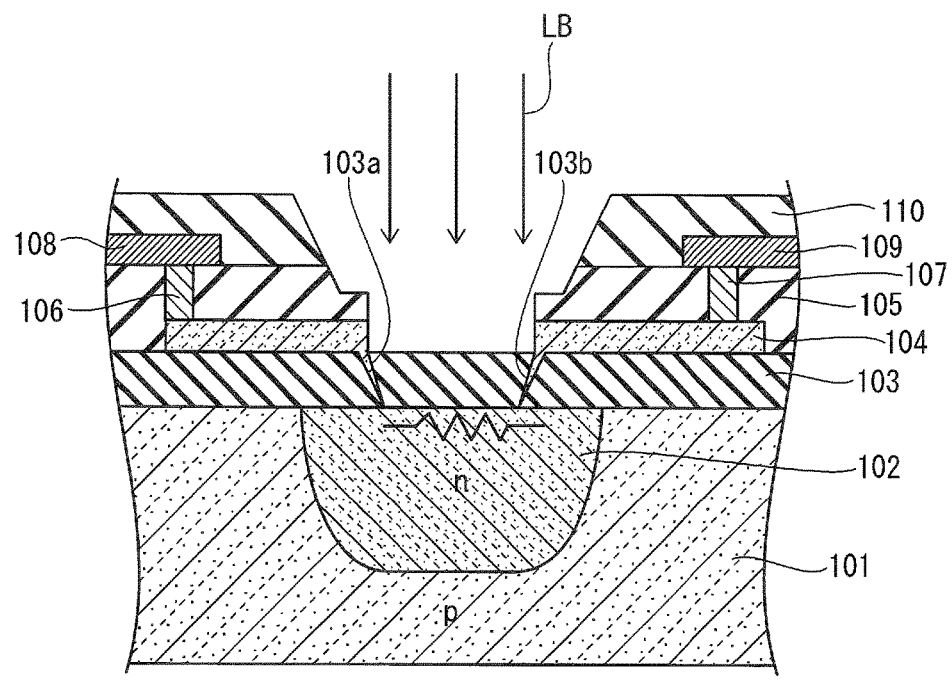
FIG. 20 is a cross-sectional view of the semiconductor device during laser trimming according to the comparative example.

When laser trimming is performed on the semiconductor device according to the comparative example, cracks 103a and 103b may be created in the first insulating film 103, and both edges of the removed part of the fuse 104 may be brought into contact with the top surface of the semiconductor substrate 101 via the cracks 103a and 103b, as illustrated in FIG. 20. Since there is a single impurity-doped region 102, the both edges of the removed part of the fuse 104 are connected to each other via the impurity-doped region 102 to establish a path for a leakage current, which leads to a trimming fault. In contrast, in the semiconductor device according to the embodiment of the present invention, since the short-circuit prevention-region 2a, the semiconductor substrate 1 and the short-circuit prevention-region 2b implement the n-p-n structure, a path for a leakage current connecting the both edges of the removed part of the fuse 4 is not established, and therefore, a trimming fault is prevented.

As illustrated in FIG. 3, the both edges of the removed part of the fuse 4 tend to reach the top surface of the semiconductor substrate 1 via the cracks 3a and 3b created around the both edges of the removed part of the fuse 4 so as to cause a short-circuit failure, when the laser irradiation area R is irradiated with the laser beam LB. In view of the short-circuit failure ascribable to the cracks 3a and 3b, the structure of the semiconductor device according to the embodiment of the present invention includes the short-circuit prevention-regions 2a and 2b, the specific portions of which are arranged to be included in the laser irradiation area R, under the both ends of the fuse 4, as illustrated in FIG. 1. Accordingly, the probability that the both edges of the removed part of the fuse 4 are guided into the regions corresponding to the short-circuit prevention-regions 2a and 2b increases, and therefore, a trimming fault is prevented steadily.

<Method for Manufacturing Semiconductor Device>

A method for manufacturing the semiconductor device according to the embodiment of the present invention is illustrated below, with reference to FIG. 6 to FIG. 13. It should be understood that the method for manufacturing the semiconductor device described below is a mere example, and the embodiment of the present invention can implement various methods other than the following method including modified examples within the scope of the invention as defined by the following appended claims. The following description is made mainly with regard to the process of manufacturing the peripheral portion of the fuse 4, and the process of manufacturing the typical active areas other than the peripheral portion of the fuse 4 is not described below.

Figure 6:
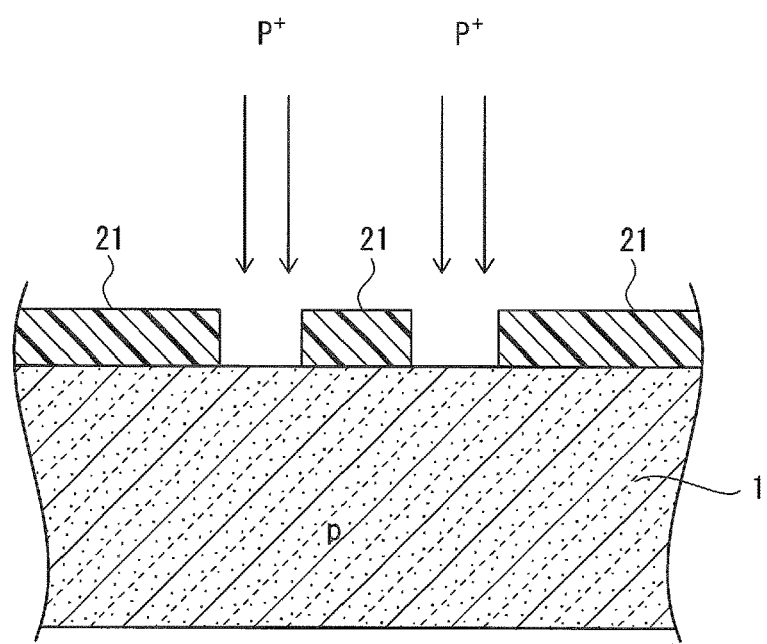
FIG. 6 is a cross-sectional view illustrating a process of manufacturing the semiconductor device according to the embodiment of the present invention.
Figure 7:
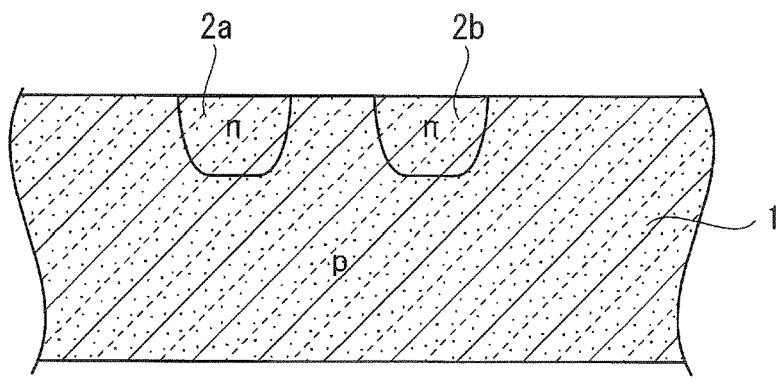
FIG. 7 is a cross-sectional view continued from FIG. 6 illustrating the process of manufacturing the semiconductor device according to the embodiment of the present invention.

First, a p-type semiconductor substrate (Si wafer) 1 is prepared. A photoresist film 21 is coated on the top surface of the semiconductor substrate 1, and is delineated by photolithography, as illustrated in FIG. 6. Using the delineated photoresist film 21 as an ion implantation mask, n-type impurity ions such as phosphorus ions ($P^+$) and arsenic ions ($As^+$) are implanted in the semiconductor substrate 1 from the top surface side. After the remaining photoresist film 21 is removed, the n-type impurity ions implanted by annealing are activated and then thermally diffused. Accordingly, rectangular n-type short-circuit prevention-regions (n-type impurity-doped regions) 2a and 2b separated from each other are formed in the upper portion of the semiconductor substrate 1, as illustrated in FIG. 7 (refer to the planar pattern in FIG. 1). The n-type guard ring regions 11a and 11b illustrated in FIG. 1 may be formed simultaneously with the short-circuit prevention-regions (impurity-doped regions) 2a and 2b.

Figure 8:
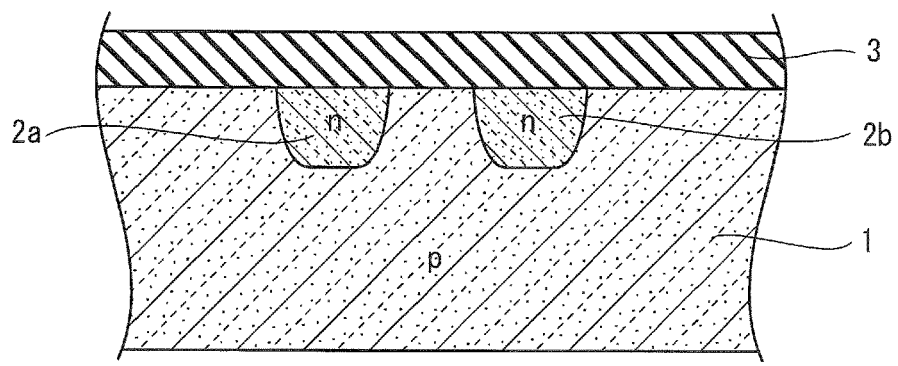
FIG. 8 is a cross-sectional view continued from FIG. 7 illustrating the process of manufacturing the semiconductor device according to the embodiment of the present invention.
Figure 9:
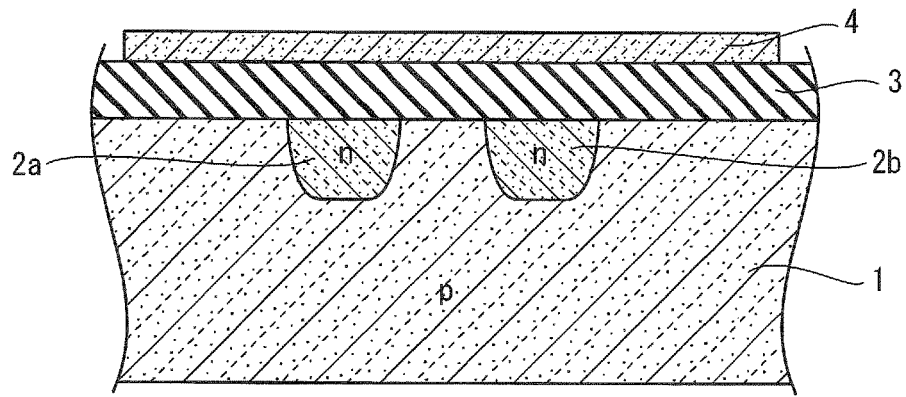
FIG. 9 is a cross-sectional view continued from FIG. 8 illustrating the process of manufacturing the semiconductor device according to the embodiment of the present invention.

Next, as illustrated in FIG. 8, the first insulating film 3 such as a $SiO_2$ film is formed on the top surface of the semiconductor substrate 1 by a thermal oxidation method or a CVD method. In the actual process, the first insulating film 3 may be formed in the same step as the step of forming an interlayer insulating film or the step of forming a field oxide film. A polysilicon layer (a doped polysilicon layer) to which impurity atoms such as P are doped is deposited on the first insulating film 3 by a CVD method, for example. A photoresist film (not illustrated) is coated on the top surface of the polysilicon layer, and is delineated by photolithography. Using the delineated photoresist film as an etching mask, a part of the polysilicon layer is selectively removed by dry etching such as reactive ion etching (RIE). The photoresist film used as a mask is then removed, so as to form the fuse 4 in a strip pattern spanning over the respective short-circuit prevention-regions 2a and 2b, as illustrated in FIG. 9.

Figure 10:
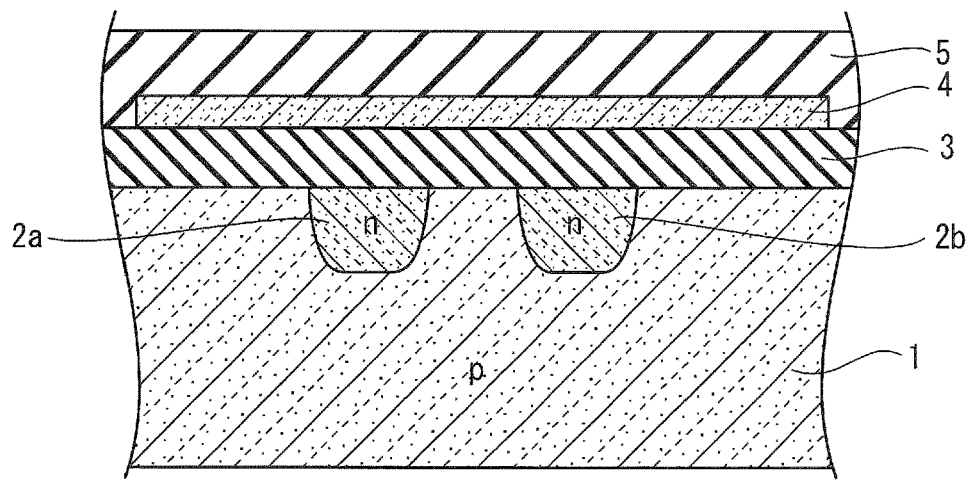
FIG. 10 is a cross-sectional view continued from FIG. 9 illustrating the process of manufacturing the semiconductor device according to the embodiment of the present invention.

Next, the second insulating film 5 is deposited on the top surfaces of the first insulating film 3 and the fuse 4 by a CVD method as illustrated in FIG. 10. When the second insulating film 5 is a PSG film, monosilane ($SiH_4$) gas, oxygen ($O_2$) gas, and phosphine ($PH_3$) gas may be used as source gases, for example. When the second insulating film 5 is a BPSG film, $SiH_4$ gas, $O_2$ gas, $PH_3$ gas, diborane ($B_2H_6$) gas, trimethoxyborane (TMB) gas, and trimethyl phosphate (TMOP) gas may be used as source gases, for example. After the second insulating film 5 is deposited, the top surface of the second insulating film 5 is flattened by a chemical mechanical polishing (CMP) method, for example.

Figure 11:
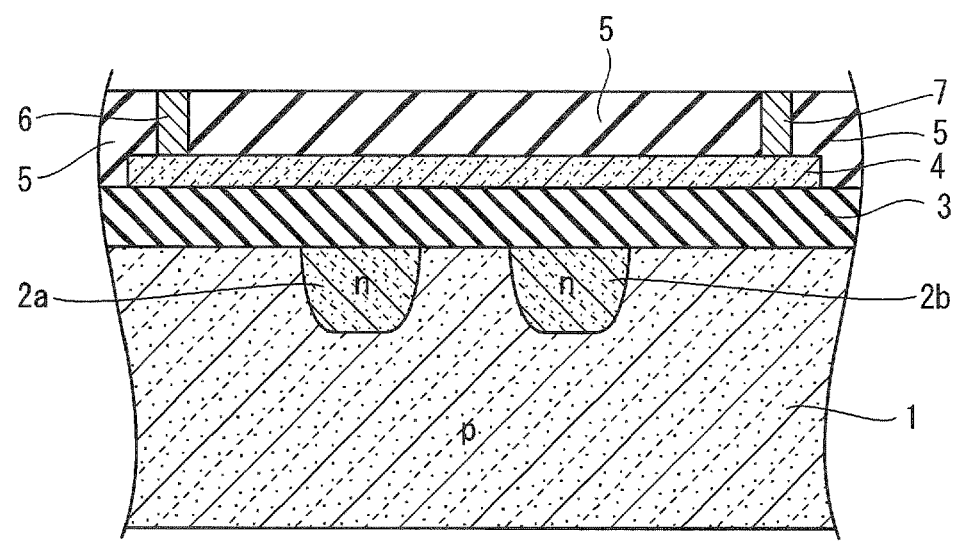
FIG. 11 is a cross-sectional view continued from FIG. 10 illustrating the process of manufacturing the semiconductor device according to the embodiment of the present invention.

Next, a photoresist film (not illustrated) is coated on the top surface of the second insulating film 5, and is delineated by photolithography. Using the delineated photoresist film as an etching mask, contact holes are open so as to penetrate the second insulating film 5 to reach the top surface of the fuse 4 by dry etching such as RIE. After the photoresist film used as a mask is removed, refractory metal such as tungsten is buried in the contact holes by sputtering or evaporation method, so as to form the contact plugs 6 and 7 connected to both ends of the fuse 4, as illustrated in FIG. 11. The contact plugs 12a and 12b connected to the guard ring regions 11a and 11b illustrated in FIG. 1 may be formed simultaneously with the contact plugs 6 and 7.

Figure 12:
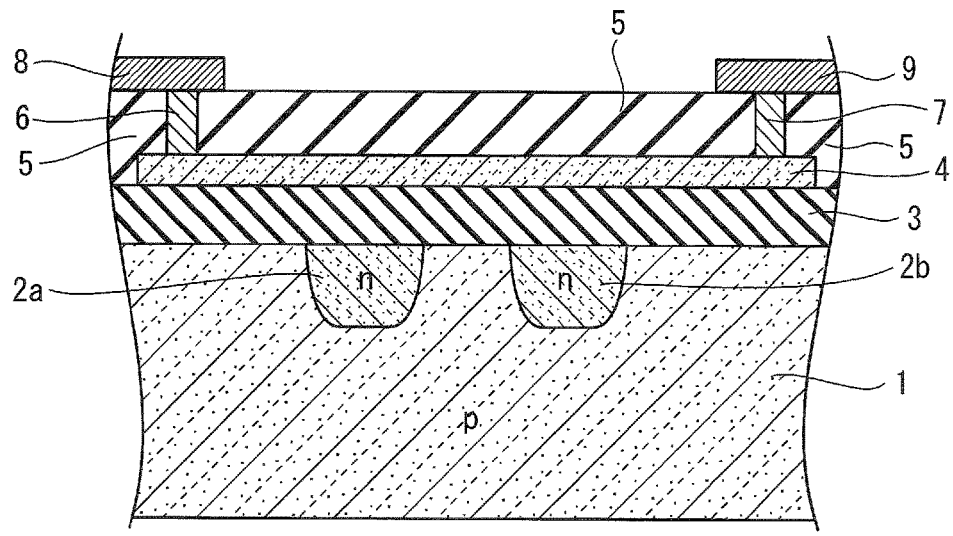
FIG. 12 is a cross-sectional view continued from FIG. 11 illustrating the process of manufacturing the semiconductor device according to the embodiment of the present invention.

Next, a metallic film is deposited on the second insulating film 5 by sputtering or evaporation method. A photoresist film (not illustrated) is coated on the metallic film, and is delineated by photolithography. Using the delineated photoresist film as an etching mask, the metallic film is delineated by dry etching such as RIE. The photoresist film used as a mask is then removed, so as to form the wiring layers 8 and 9 connected to the contact plugs 6 and 7, as illustrated in FIG. 12.

Figure 13:
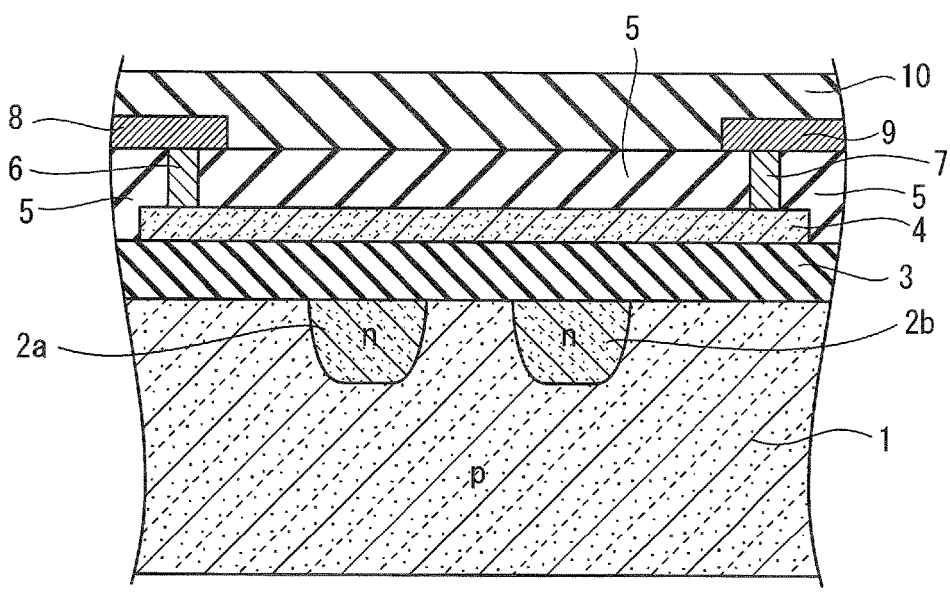
FIG. 13 is a cross-sectional view continued from FIG. 12 illustrating the process of manufacturing the semiconductor device according to the embodiment of the present invention.

Next, as illustrated in FIG. 13, the passivation film 10 such as a $Si_3N_4$ film is deposited on the second insulating film 5 and the wiring layers 8 and 9 by a CVD method or a coating method, for example. A photoresist film (not illustrated) is coated on the passivation film 10, and is delineated by photolithography. Using the delineated photoresist film as an etching mask, a part of the passivation film 10 is selectively removed to form the opening 10a as illustrated in FIG. 1, and the upper portion of the second insulating film 5 is selectively removed to form the recess 5a, by use of dry etching such as RIE or wet etching. The passivation film 10 and the second insulating film 5 may be etched sequentially, or etched independently while varying an etch selectivity. Accordingly, the structure of the semiconductor device according to the embodiment of the present invention before the laser trimming is completed.

After a specific fuse 4 is determined to be a target to be blown, in the following laser trimming step, the fuse 4 located at a predetermined position corresponding to the specific opening 10a of the passivation film 10 is blown. In the laser trimming, when the cracks 3a and 3b are created in the first insulating film 3 as illustrated in FIG. 3, both edges of the removed part of the fuse 4 may be guided to be contact with the semiconductor substrate 1 via the cracks 3a and 3b. In the semiconductor device, the both edges of the removed part of the fuse 4 are brought into contact with the short-circuit prevention-regions 2a and 2b separated from each other, and therefore, a trimming fault can be prevented.

First Modified Example

Figure 14:
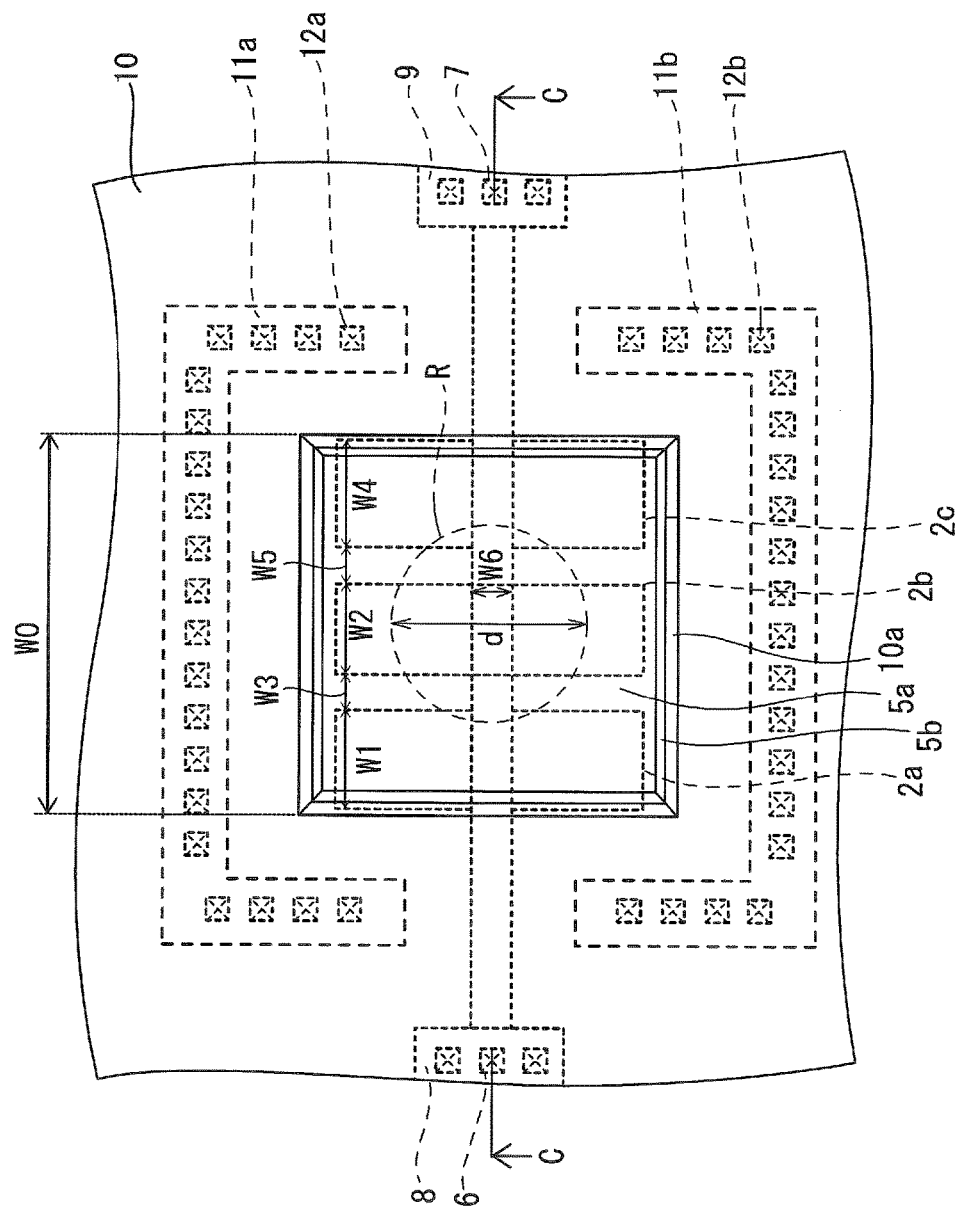
FIG. 14 a plan view illustrating a semiconductor device according to a first modified example of the embodiment of the present invention.
Figure 15:
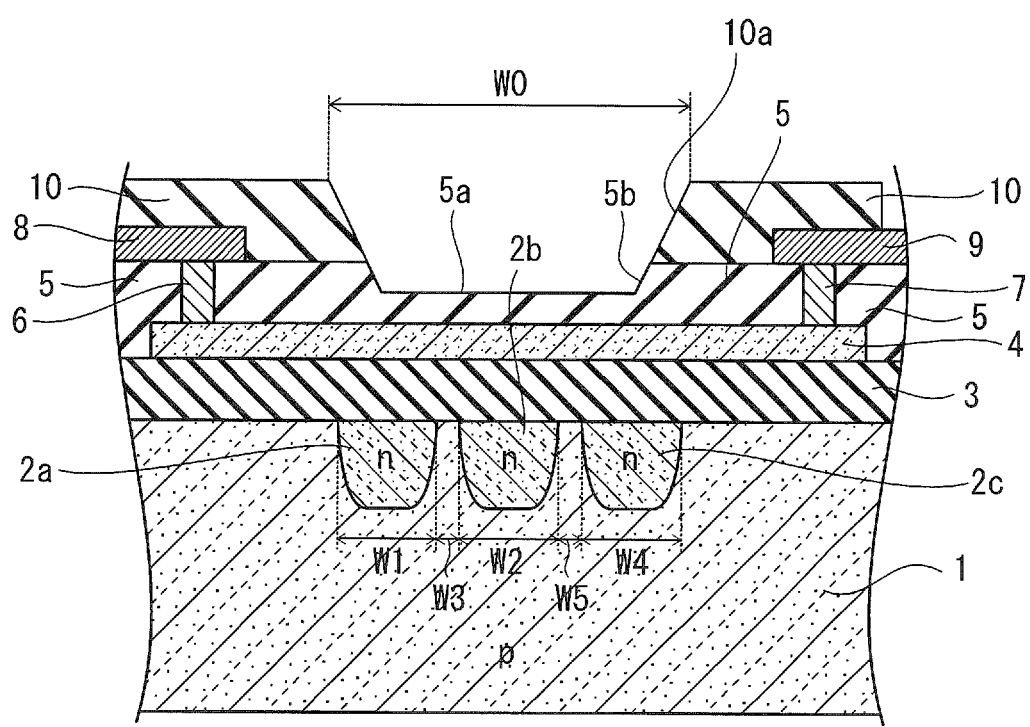
FIG. 15 is a cross-sectional view as viewed from direction C-C in FIG. 14.

The embodiment of the present invention has been illustrated with the case in which the two short-circuit prevention-regions 2a and 2b are buried in the upper portion of the semiconductor substrate 1, but is not limited to this case, and the number of the short-circuit prevention-regions may be three or more. For example, as illustrated in FIG. 14 and FIG. 15, three short-circuit prevention-regions 2a, 2b, and 2c may be buried in the upper portion of the semiconductor substrate 1. The respective widths W1, W2, and W4 of the three short-circuit prevention-regions 2a, 2b, and 2c may be either the same or different from each other. The spaces W3 and W5 between the three short-circuit prevention-regions 2a, 2b, and 2c may be either the same or different from each other.

Second Modified Example

Figure 16:
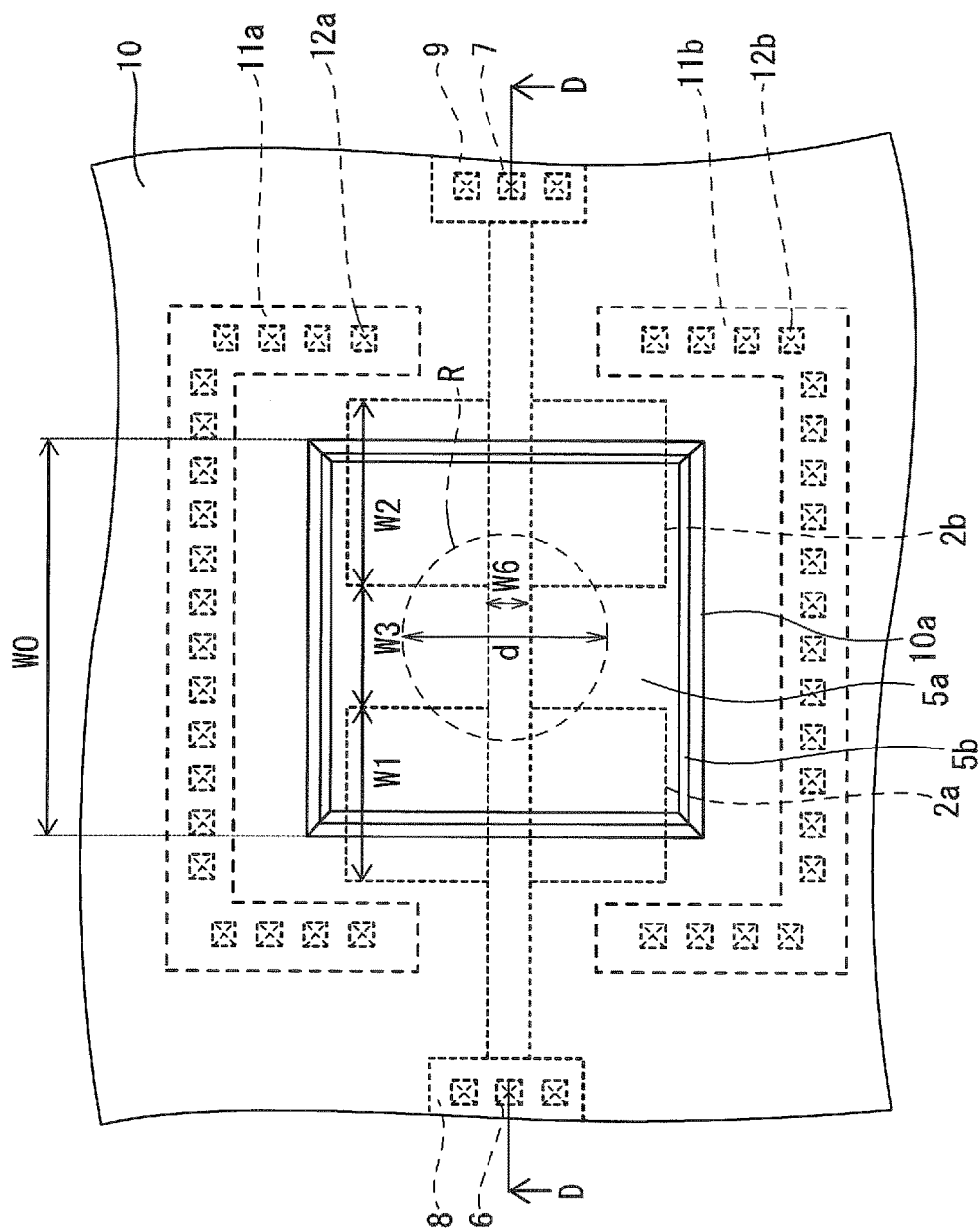
FIG. 16 is a plan view illustrating a semiconductor device according to a second modified example of the embodiment of the present invention.
Figure 17:
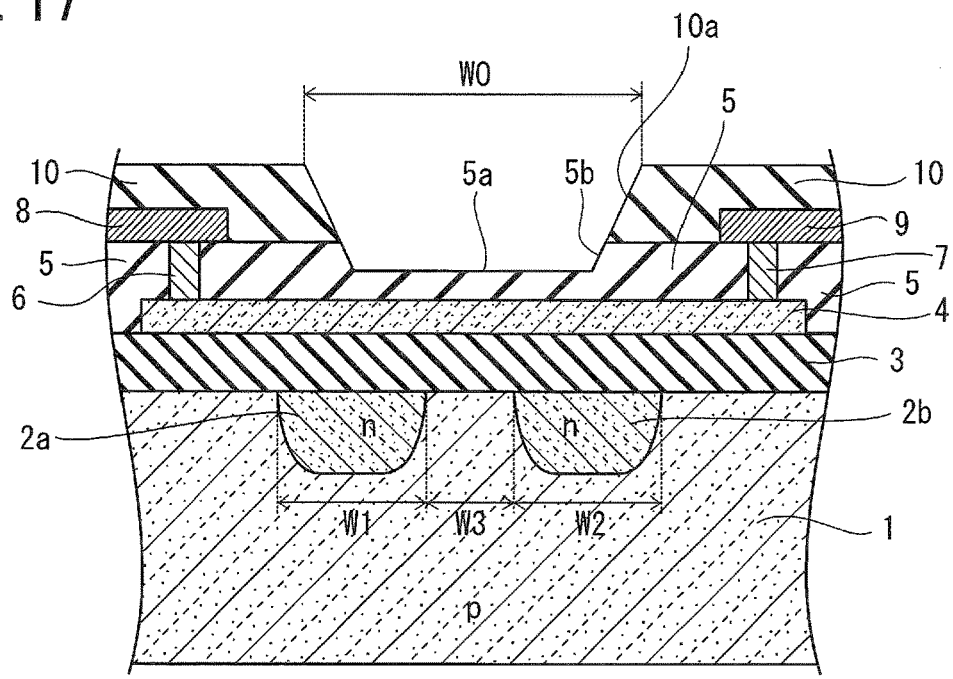
FIG. 17 is a cross-sectional view as viewed from direction D-D in FIG. 16.

The embodiment of the present invention has been illustrated with the case in which the side ends on the outer side of the short-circuit prevention-regions 2a and 2b in the upper portion of the semiconductor substrate 1 in the longitudinal direction of the fuse 4 substantially overlap with the outline of the opening 10a, as illustrated in FIG. 1 and FIG. 2, but is not limited to this case. For example, as illustrated in FIG. 16 and FIG. 17, the side ends on the outer side of the short-circuit prevention-regions 2a and 2b in the upper portion of the semiconductor substrate 1 may be located on the outside of the opening 10a and located on the inside of the guard ring regions 11a and 11b illustrated in FIG. 16. Alternatively, although not illustrated in the Drawings, the side ends on the outer side of the short-circuit prevention-regions 2a and 2b in the upper portion of the semiconductor substrate 1 may be located on the inside of the opening 10a. The short-circuit prevention-regions 2a and 2b are preferably buried in portions where the probability that both edges of a removed part of the fuse 4 are brought into contact is high.

Other Embodiments

While the present invention has been described above by reference to the embodiment, it should be understood that the present invention is not intended to be limited to the descriptions of the Specification and the Drawings composing part of this disclosure. Various alternative embodiments, examples, and technical applications will be apparent to those skilled in the art according to this disclosure.

Figure 18:
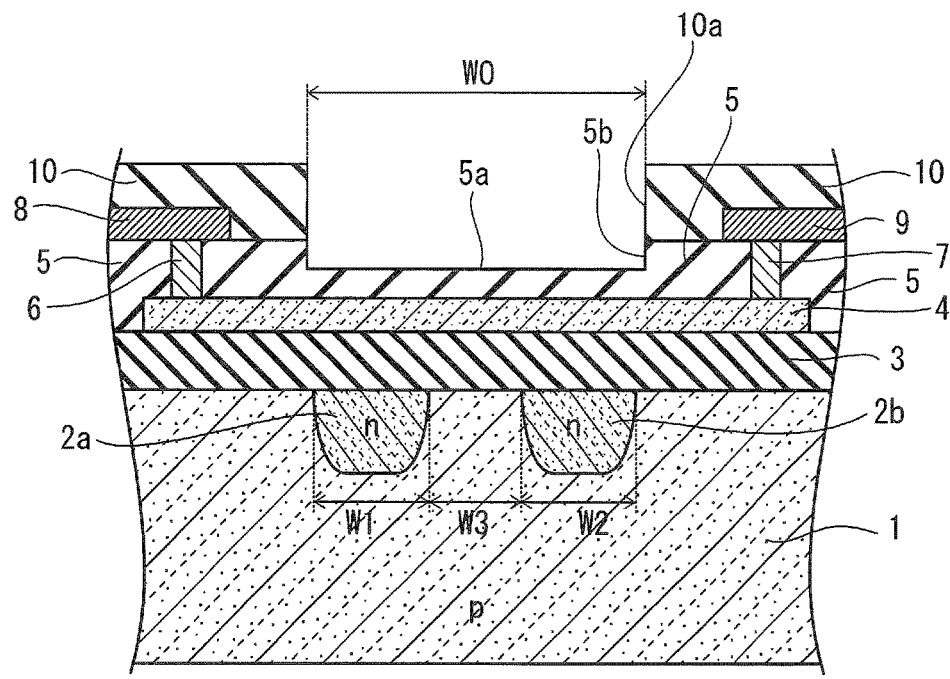
FIG. 18 is a plan view illustrating a semiconductor device according to another embodiment of the present invention.

While the embodiment has exemplified the opening 10a for laser trimming in the passivation film 10 which has a tapered shape, the opening 10a for laser trimming in the passivation film 10 may be cut vertically, and the lower sidewall 5b of the recess 5a of the second insulating film 5 may be provided vertically, as illustrated in FIG. 18.

While the embodiment has exemplified the semiconductor device including the semiconductor substrate 1 of the Si wafer, the embodiment may be applicable to a semiconductor device using a semiconductor wafer made of a wide-bandgap semiconductor such as silicon carbide (SiC), gallium nitride (GaN), or diamond.

What is claimed is:

1. A semiconductor device comprising:
    a semiconductor substrate of a first conductivity type;
    a plurality of short-circuit prevention-regions of a second conductivity type buried in an upper portion of the semiconductor substrate and separated from each other;
    a first insulating film laminated on a top surface of the semiconductor substrate;
    a strip-shaped fuse provided on a top surface of the first insulating film, spanning over the plurality of short-circuit prevention-regions;
    a second insulating film covering a top surface of the fuse; and
    a passivation film stacked on a top surface of the second insulating film and having an opening for laser trimming,
    wherein the opening exposes the second insulating film above an area, in which the plurality of short-circuit prevention-regions is included.

2. The semiconductor device of claim 1, wherein the second insulating film located below the opening is provided with a recess.

3. The semiconductor device of claim 1, wherein two of the short-circuit prevention-regions are arranged to include regions below both ends of the fuse included in a laser irradiation region irradiated with a laser beam for the laser trimming.

4. A method for manufacturing a semiconductor device, comprising:
    forming a plurality of short-circuit prevention-regions of a second conductivity type, being separated from each other, in an upper portion of a semiconductor substrate of a first conductivity type;
    forming a first insulating film on a top surface of the semiconductor substrate;
    delineating a fuse on a top surface of the first insulating film into a strip pattern so as to span over the plurality of short-circuit prevention-regions;
    covering a second insulating film on a top surface of the fuse;
    depositing a passivation film on a top surface of the second insulating film; and
    cutting an opening for laser trimming in the passivation film and expose the second insulating film above an area including the plurality of short-circuit prevention-regions.

* * * * *